United States Patent
Baptist et al.

(10) Patent No.: US 10,305,982 B2
(45) Date of Patent: May 28, 2019

(54) ACCESS SLICES DURING MULTIPLE MIGRATIONS

(71) Applicant: International Business Machines Corporation, Armonk, NY (US)

(72) Inventors: Andrew D. Baptist, Mt. Pleasant, WI (US); Manish Motwani, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 147 days.

(21) Appl. No.: 15/407,023

(22) Filed: Jan. 16, 2017

(65) Prior Publication Data

US 2017/0214741 A1 Jul. 27, 2017

Related U.S. Application Data

(60) Provisional application No. 62/287,145, filed on Jan. 26, 2016.

(51) Int. Cl.
*G06F 15/16* (2006.01)
*H04L 29/08* (2006.01)
(Continued)

(52) U.S. Cl.
CPC ........ *H04L 67/1095* (2013.01); *G06F 3/0604* (2013.01); *G06F 3/064* (2013.01);
(Continued)

(58) Field of Classification Search
CPC ............. H04L 67/1095; H04L 67/1097; H04L 61/1582; H04L 67/26; H04L 67/2842;
(Continued)

(56) References Cited

U.S. PATENT DOCUMENTS 4,092,732 A 5/1978 Ouchi
5,454,101 A 9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Cheikh T Ndiaye
(74) *Attorney, Agent, or Firm* — Garlick & Markison; Timothy W. Markison; Randy W. Lacasse

(57) ABSTRACT

A method begins by identifying, when a first migration of a plurality of sets of encoded data slices from an original source storage set to an intermediate destination storage set is active, a new destination storage set of a second migration for the plurality of sets of encoded data slices. The method continues by issuing migration requests to storage sets associated with current storage of the plurality of sets of encoded data slices in accordance with a first cursor identifying a particular DSN storage address of a corresponding set of encoded data slices and, when the second migration is active, facilitating processing of a data access request to produce a data access response utilizing the first cursor of the first migration and a second cursor identifying a particular DSN address of a corresponding set of encoded data slices that is next up for migration.

20 Claims, 7 Drawing Sheets

(51) Int. Cl.

| | | |
|---|---|---|
| *G06F 17/30* | (2006.01) | |
| *G06F 3/06* | (2006.01) | |
| *G06F 11/10* | (2006.01) | |
| *G06F 12/0813* | (2016.01) | |
| *G06F 12/0837* | (2016.01) | |
| *H03M 13/15* | (2006.01) | |
| *H04H 60/27* | (2008.01) | |
| *G06N 3/00* | (2006.01) | |
| *G06F 12/0871* | (2016.01) | |
| *G06F 12/122* | (2016.01) | |
| *G06F 12/128* | (2016.01) | |
| *G06F 9/50* | (2006.01) | |
| *H03M 13/37* | (2006.01) | |
| *G06F 12/12* | (2016.01) | |

(52) U.S. Cl.
CPC ............ *G06F 3/067* (2013.01); *G06F 3/0611* (2013.01); *G06F 3/0619* (2013.01); *G06F 3/0632* (2013.01); *G06F 3/0647* (2013.01); *G06F 3/0659* (2013.01); *G06F 9/5083* (2013.01); *G06F 11/1076* (2013.01); *G06F 11/1092* (2013.01); *G06F 12/0813* (2013.01); *G06F 12/0837* (2013.01); *G06F 12/0871* (2013.01); *G06F 12/122* (2013.01); *G06F 12/128* (2013.01); *G06F 17/303* (2013.01); *G06F 17/30327* (2013.01); *G06F 17/30377* (2013.01); *G06N 3/002* (2013.01); *H03M 13/1515* (2013.01); *H03M 13/3761* (2013.01); *H04H 60/27* (2013.01); *H04L 67/1097* (2013.01); *H04L 67/26* (2013.01); *H04L 67/2842* (2013.01); *G06F 12/12* (2013.01); *G06F 2212/604* (2013.01)

(58) Field of Classification Search
CPC ....... H04L 29/08; H04L 29/12; G06F 17/303; G06F 3/0619; G06F 12/0837; G06F 11/1076; G06F 3/067; G06F 3/064; G06F 12/0813; G06F 11/1092; G06F 3/0604; G06F 3/0632; G06F 12/0871; G06F 12/122; G06F 12/128; G06F 3/0611; G06F 3/0659; G06F 9/5083; G06F 17/30327; G06F 17/30377; G06F 3/0647; G06F 12/12; G06F 2212/604; G06F 17/30; H04H 60/27; H03M 13/1515; G06N 3/002
See application file for complete search history.

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 7,921,179 | B1* | 4/2011 | Zheng ................. H04L 67/1097 709/213 |
| 8,341,459 | B2* | 12/2012 | Kaushik ................. G06F 3/0617 709/232 |
| 8,751,533 | B1* | 6/2014 | Dhavale ................. G06F 3/0647 707/782 |
| 9,710,187 | B1* | 7/2017 | Si ............................. G06F 3/065 |
| 9,875,043 | B1* | 1/2018 | Suldhal ................. G06F 3/0619 |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0080558 | A1* | 4/2004 | Blumenau ........... G06F 11/1435 347/19 |
| 2004/0122917 | A1 | 6/2004 | Menon et al. |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters, III et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2012/0226860 | A1* | 9/2012 | Saito ..................... G06F 3/0617 711/118 |
| 2015/0254257 | A1* | 9/2015 | Kritchko ........... G06F 17/30575 707/634 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

(56) References Cited

OTHER PUBLICATIONS

Chung; An Automatic Data Segmentation Method for 3D Measured Data Points; National Taiwan University; pp. 1-8; 1998.
Plank, T1: Erasure Codes for Storage Applications; FAST2005, 4th Usenix Conference on File Storage Technologies; Dec. 13-16, 2005; pp. 1-74.
Wildi; Java iSCSi Initiator; Master Thesis; Department of Computer and Information Science, University of Konstanz; Feb. 2007; 60 pgs.
Legg; Lightweight Directory Access Protocol (LDAP): Syntaxes and Matching Rules; IETF Network Working Group; RFC 4517; Jun. 2006; pp. 1-50.
Zeilenga; Lightweight Directory Access Protocol (LDAP): Internationalized String Preparation; IETF Network Working Group; RFC 4518; Jun. 2006; pp. 1-14.
Smith; Lightweight Directory Access Protocol (LDAP): Uniform Resource Locator; IETF Network Working Group; RFC 4516; Jun. 2006; pp. 1-15.
Smith; Lightweight Directory Access Protocol (LDAP): String Representation of Search Filters; IETF Network Working Group; RFC 4515; Jun. 2006; pp. 1-12.
Zeilenga; Lightweight Directory Access Protocol (LDAP): Directory Information Models; IETF Network Working Group; RFC 4512; Jun. 2006; pp. 1-49.
Sciberras; Lightweight Directory Access Protocol (LDAP): Schema for User Applications; IETF Network Working Group; RFC 4519; Jun. 2006; pp. 1-33.
Harrison; Lightweight Directory Access Protocol (LDAP): Authentication Methods and Security Mechanisms; IETF Network Working Group; RFC 4513; Jun. 2006; pp. 1-32.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

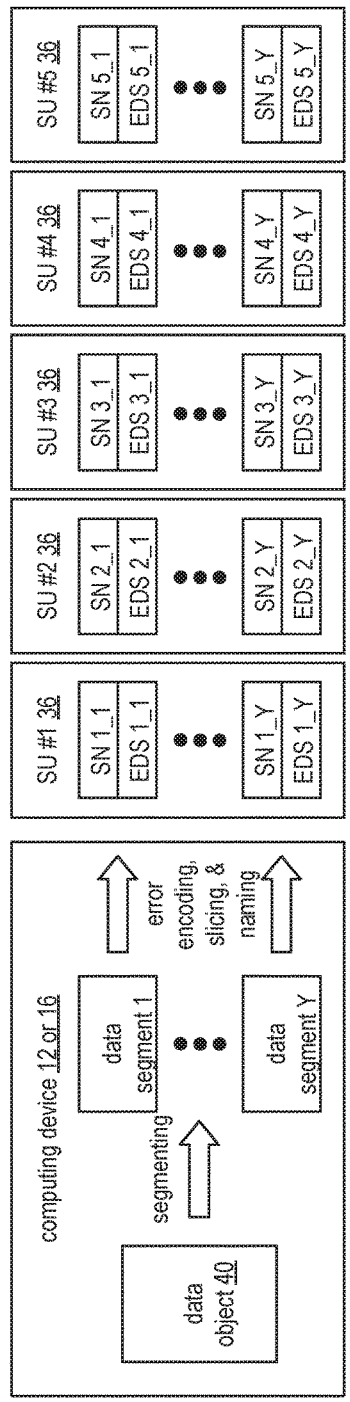
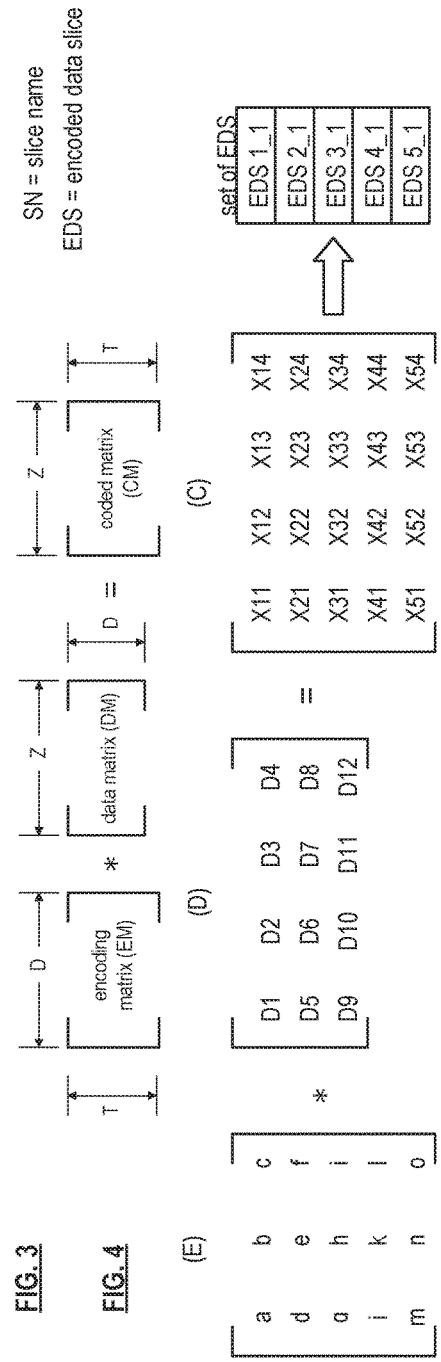
FIG. 3
FIG. 4
FIG. 5
FIG. 6

ACCESS SLICES DURING MULTIPLE MIGRATIONS

CROSS-REFERENCE TO RELATED APPLICATIONS

The present U.S. Utility Patent Application claims priority pursuant to 35 U.S.C. § 119(e) to U.S. Provisional Application No. 62/287,145, entitled "VERIFYING INTEGRITY OF ENCODED DATA SLICES," filed Jan. 26, 2016, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
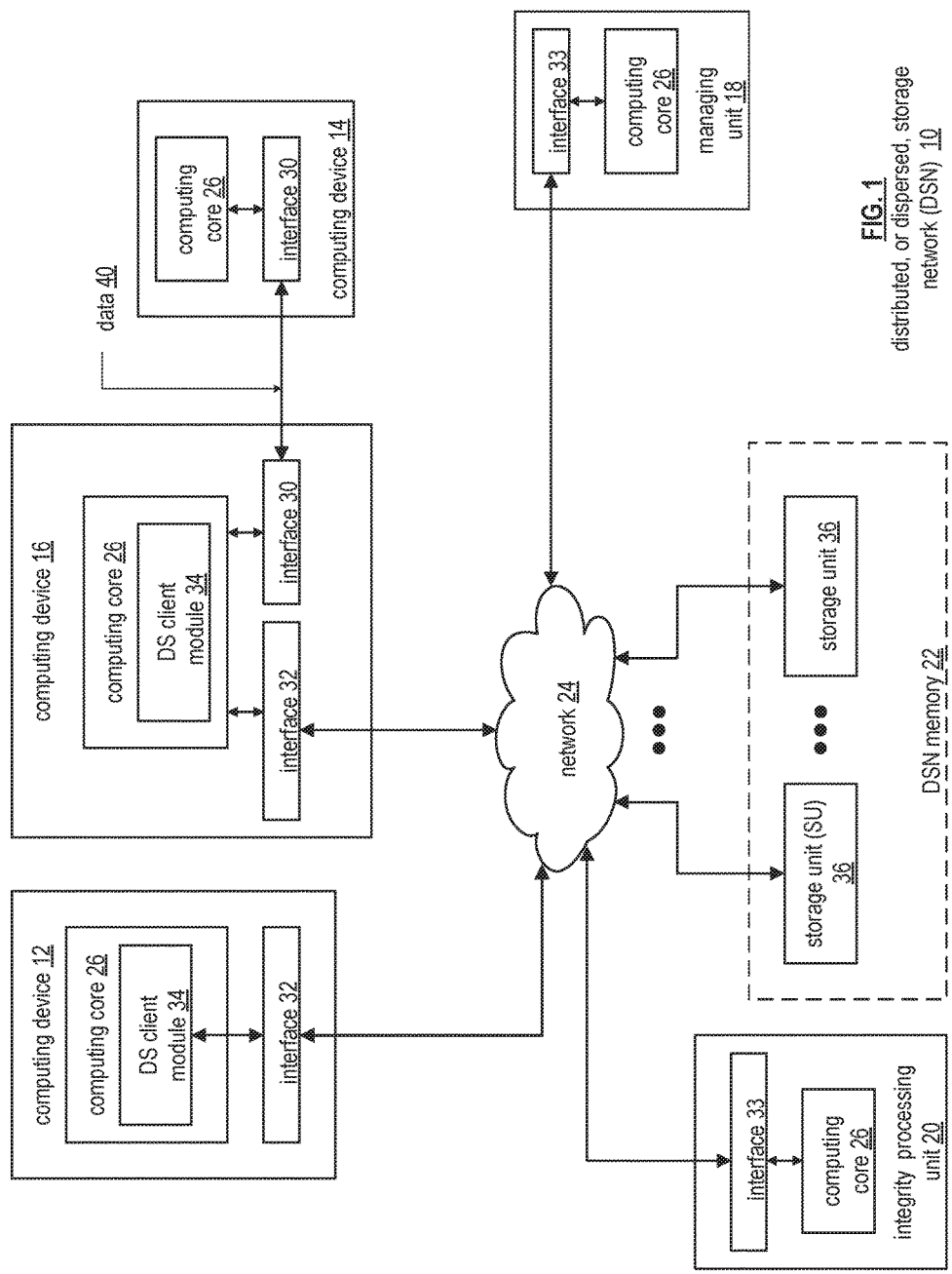
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
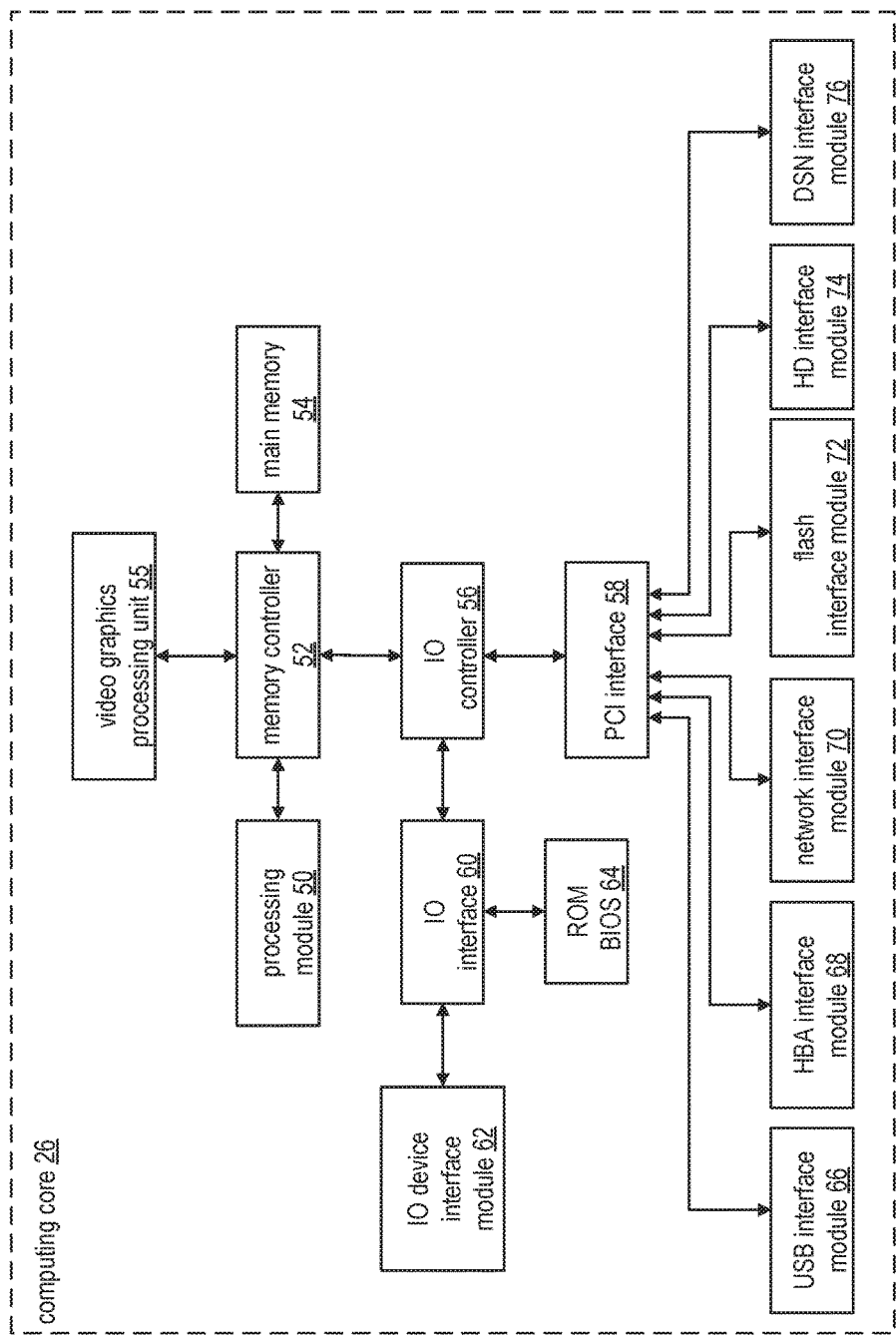
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSTN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSTN managing unit 18 tracks the number of times a user accesses a non-public vault and/or public vaults, which can be used to generate per-access billing information. In another instance, the DSTN managing unit 18 tracks the amount of data stored and/or retrieved by a user device and/or a user group, which can be used to generate per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSTN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
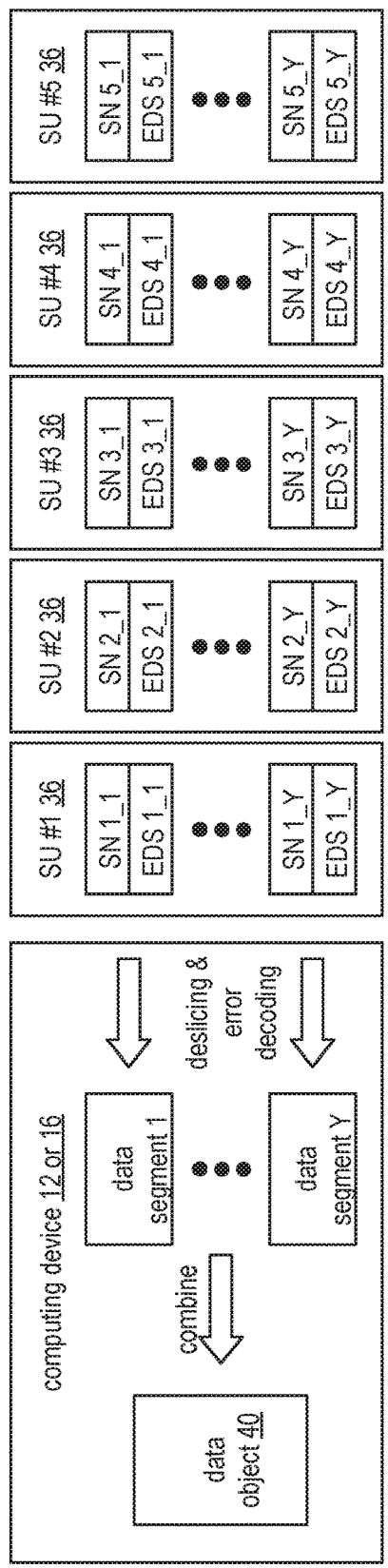
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
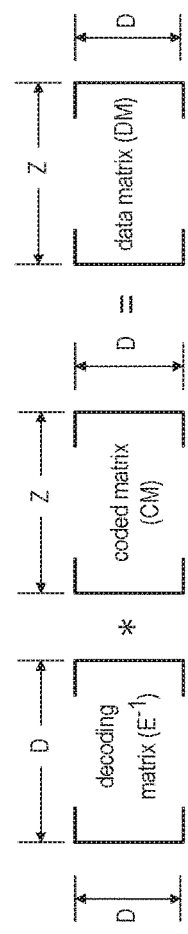
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
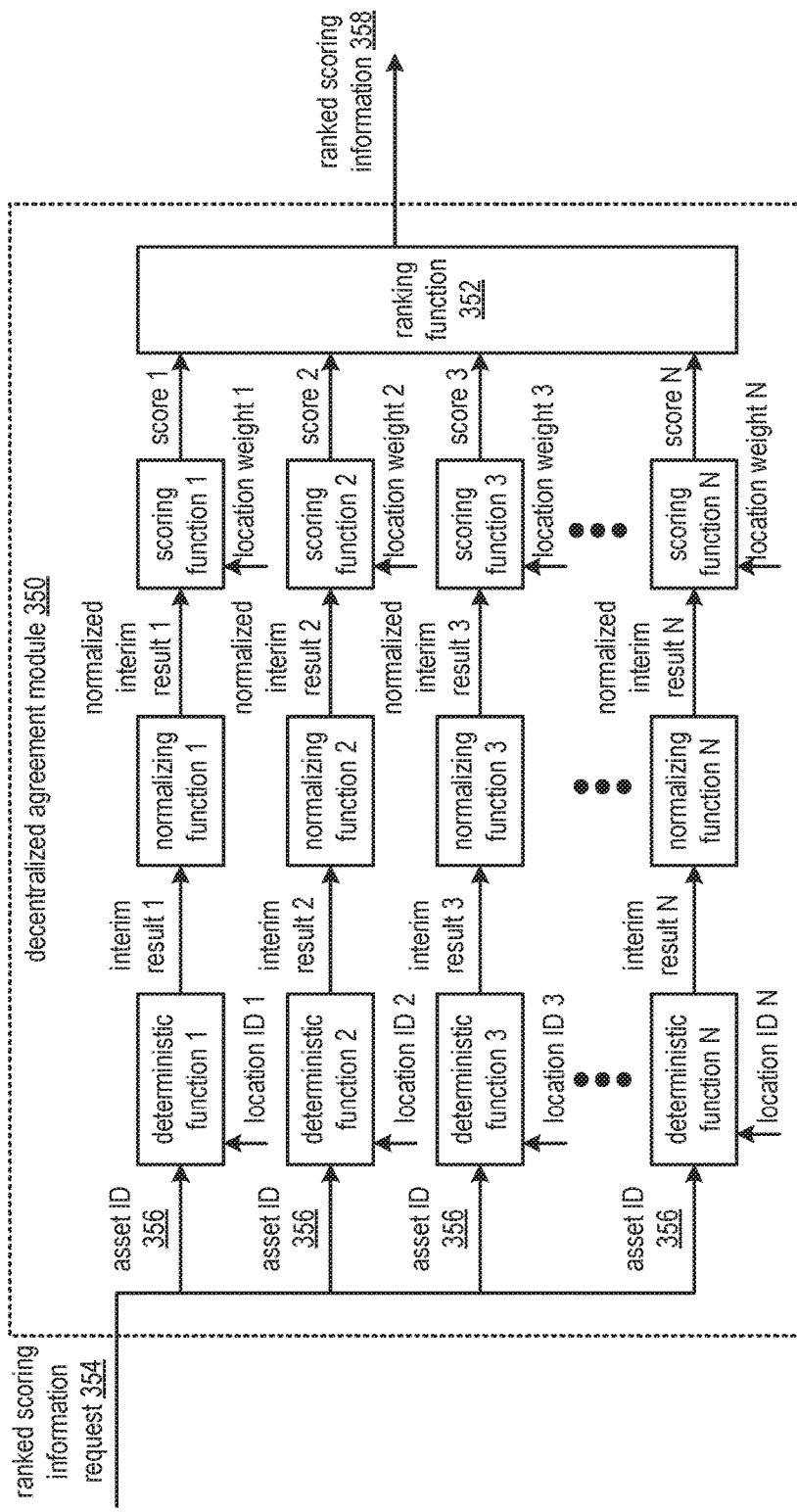
FIG. 9 is a schematic block diagram of an embodiment of a decentralized agreement module in accordance with the present invention.

FIG. 9 illustrates a decentralized agreement module 350 that includes a set of deterministic functions 1-N, a set of normalizing functions 1-N, a set of scoring functions 1-N, and a ranking function 352. Each of the deterministic function, the normalizing function, the scoring function, and the ranking function 352, may be implemented utilizing any module and/or unit of a dispersed storage network (DSN). For example, the decentralized agreement module is implemented utilizing the distributed storage and task (DST) client module 34 of FIG. 1.

The decentralized agreement module 350 functions to receive a ranked scoring information request 354 and to generate ranked scoring information 358 based on the ranked scoring information request 354 and other information. The ranked scoring information request 354 includes one or more of an asset identifier (ID) 356 of an asset associated with the request, an asset type indicator, one or more location identifiers of locations associated with the DSN, one or more corresponding location weights, and a requesting entity ID. The asset includes any portion of data associated with the DSN including one or more asset types including a data object, a data record, an encoded data slice, a data segment, a set of encoded data slices, and a plurality of sets of encoded data slices. As such, the asset ID 356 of the asset includes one or more of a data name, a data record identifier, a source name, a slice name, and a plurality of sets of slice names.

Each location of the DSN includes an aspect of a DSN resource. Examples of locations includes one or more of a storage unit, a memory device of the storage unit, a site, a storage pool of storage units, a pillar index associated with each encoded data slice of a set of encoded data slices generated by an information dispersal algorithm (IDA), a DST client module 34 of FIG. 1, a DST processing unit 16 (computing device) of FIG. 1, a DST integrity processing unit 20 of FIG. 1, a DSTN managing unit 18 of FIG. 1, a user device 12 of FIG. 1, and a user device 14 of FIG. 1.

Each location is associated with a location weight based on one or more of a resource prioritization of utilization scheme and physical configuration of the DSN. The location weight includes an arbitrary bias which adjusts a proportion of selections to an associated location such that a probability that an asset will be mapped to that location is equal to the location weight divided by a sum of all location weights for all locations of comparison. For example, each storage pool of a plurality of storage pools is associated with a location weight based on storage capacity. For instance, storage pools with more storage capacity are associated with higher location weights than others. The other information may include a set of location identifiers and a set of location weights associated with the set of location identifiers. For example, the other information includes location identifiers and location weights associated with a set of memory devices of a storage unit when the requesting entity utilizes the decentralized agreement module 350 to produce ranked scoring information 358 with regards to selection of a memory device of the set of memory devices for accessing a particular encoded data slice (e.g., where the asset ID includes a slice name of the particular encoded data slice).

The decentralized agreement module 350 outputs substantially identical ranked scoring information for each ranked scoring information request that includes substantially identical content of the ranked scoring information request. For example, a first requesting entity issues a first ranked scoring information request to the decentralized agreement module 350 and receives first ranked scoring information. A second requesting entity issues a second ranked scoring information request to the decentralized agreement module and receives second ranked scoring information. The second ranked scoring information is substantially the same as the first ranked scoring information when the second ranked scoring information request is substantially the same as the first ranked scoring information request.

As such, two or more requesting entities may utilize the decentralized agreement module 350 to determine substantially identical ranked scoring information. As a specific example, the first requesting entity selects a first storage pool of a plurality of storage pools for storing a set of encoded data slices utilizing the decentralized agreement module 350 and the second requesting entity identifies the first storage pool of the plurality of storage pools for retrieving the set of encoded data slices utilizing the decentralized agreement module 350.

In an example of operation, the decentralized agreement module 350 receives the ranked scoring information request 354. Each deterministic function performs a deterministic function on a combination and/or concatenation (e.g., add, append, interleave) of the asset ID 356 of the ranked scoring information request 354 and an associated location ID of the set of location IDs to produce an interim result. The deterministic function includes at least one of a hashing function, a hash-based message authentication code function, a mask generating function, a cyclic redundancy code function, hashing module of a number of locations, consistent hashing, rendezvous hashing, and a sponge function. As a specific example, deterministic function 2 appends a location ID 2 of a storage pool 2 to a source name as the asset ID to produce a combined value and performs the mask generating function on the combined value to produce interim result 2.

With a set of interim results 1-N, each normalizing function performs a normalizing function on a corresponding interim result to produce a corresponding normalized interim result. The performing of the normalizing function includes dividing the interim result by a number of possible permutations of the output of the deterministic function to produce the normalized interim result. For example, normalizing function 2 performs the normalizing function on the interim result 2 to produce a normalized interim result 2.

With a set of normalized interim results 1-N, each scoring function performs a scoring function on a corresponding normalized interim result to produce a corresponding score. The performing of the scoring function includes dividing an associated location weight by a negative log of the normalized interim result. For example, scoring function 2 divides location weight 2 of the storage pool 2 (e.g., associated with location ID 2) by a negative log of the normalized interim result 2 to produce a score 2.

With a set of scores 1-N, the ranking function 352 performs a ranking function on the set of scores 1-N to generate the ranked scoring information 358. The ranking function includes rank ordering each score with other scores of the set of scores 1-N, where a highest score is ranked first. As such, a location associated with the highest score may be considered a highest priority location for resource utilization (e.g., accessing, storing, retrieving, etc., the given asset of the request). Having generated the ranked scoring information 358, the decentralized agreement module 350 outputs the ranked scoring information 358 to the requesting entity.

In one embodiment, when processing placement of encoded data slices by moving them according to a Decentralized Agreement Protocol (DAP), slice names can be processed according to some ordering. For example, for a slice name range to be processed, start with slice names that lexicographically come earlier first, and then proceed in the order of the slice names in that range according to their sorted order. This enables immediate determination of which parts of that namespace range have been processed and which ones are yet to be processed. This border is defined by a "cursor", which moves across the range as progress is made across it. For example, at 3 different time intervals:

```
1 : |---->------------------------------------------|

2 : |--------------------------->--------------------|

3 : |----------------------------------------------->|
```

The ">" represents the cursor as it begins to start, with all slice names to the "left" of the cursor having been processed according to the DAP. By processed, this means each extant slice name within that processed range has been evaluated and if necessary, moved, if according to the DAP, a new DS unit is now responsible for this slice. Once the cursor makes it to the end of the range (time 3) all slice names in this range are now in their correct locations according to the DAP and a current Resource Map. However, there may be occasions when the Resource Map (and accordingly the determinations by the DAP) is updated multiple times before the cursor completes. In this case, multiple cursors must be created and tracked separately. For example, let's say one DAP configuration X, is made, and a cursor for X begins to make progress:

```
       (processed for X) (unprocessed)
       1:|-----------------------------------> ---------------
```

Now consider a second DAP change Y, which occurs before the X change has completed:

```
       (processed for Y) (processed for X) (unprocessed)
       2:|--------------> -----------------------> ---------------|
```

When the Y change comes out, there may no longer necessarily be a need to continue to process updates according to X. If this is the case, then cursor X will "freeze" in its position and make no further progress. Eventually, the "Y" cursor will overtake X:

```
       (processed for Y) (unprocessed)
       2:|-----------------------------------> ---------------
```

When a later change overtakes a previous change, the DS unit no longer needs to separately track cursor X. When a read or write request comes in, where it happens to fall (e.g. within the range Y, within the range X, or within the unprocessed range) determines how the read or write request is processed. For example, if it falls into the range governed by names processed for DAP configuration X, then requests may need to be proxied/relayed to the DS unit the slice would have been reallocated to according to X. If the DS unit that receives the request has already processed that slice by DAP configuration Y, then it may need to proxy it the request to the location indicated by DAP configuration Y. The movement of the latest cursor, associated with the latest change, continues until it reaches the end of the range. One exception to this is when a later DAP configuration restores the state of the system to what it was previously. For example, if state X was the expanding of one storage set, and state Y was returning it to its previous state, then the cursor progress can complete as soon as Y's cursor catches up to cursor X. This is because the "unprocessed" range is identical to the state as it should be for state Y. This can be used to "rollback" a DAP or Resource Map change.

Figure 9A:
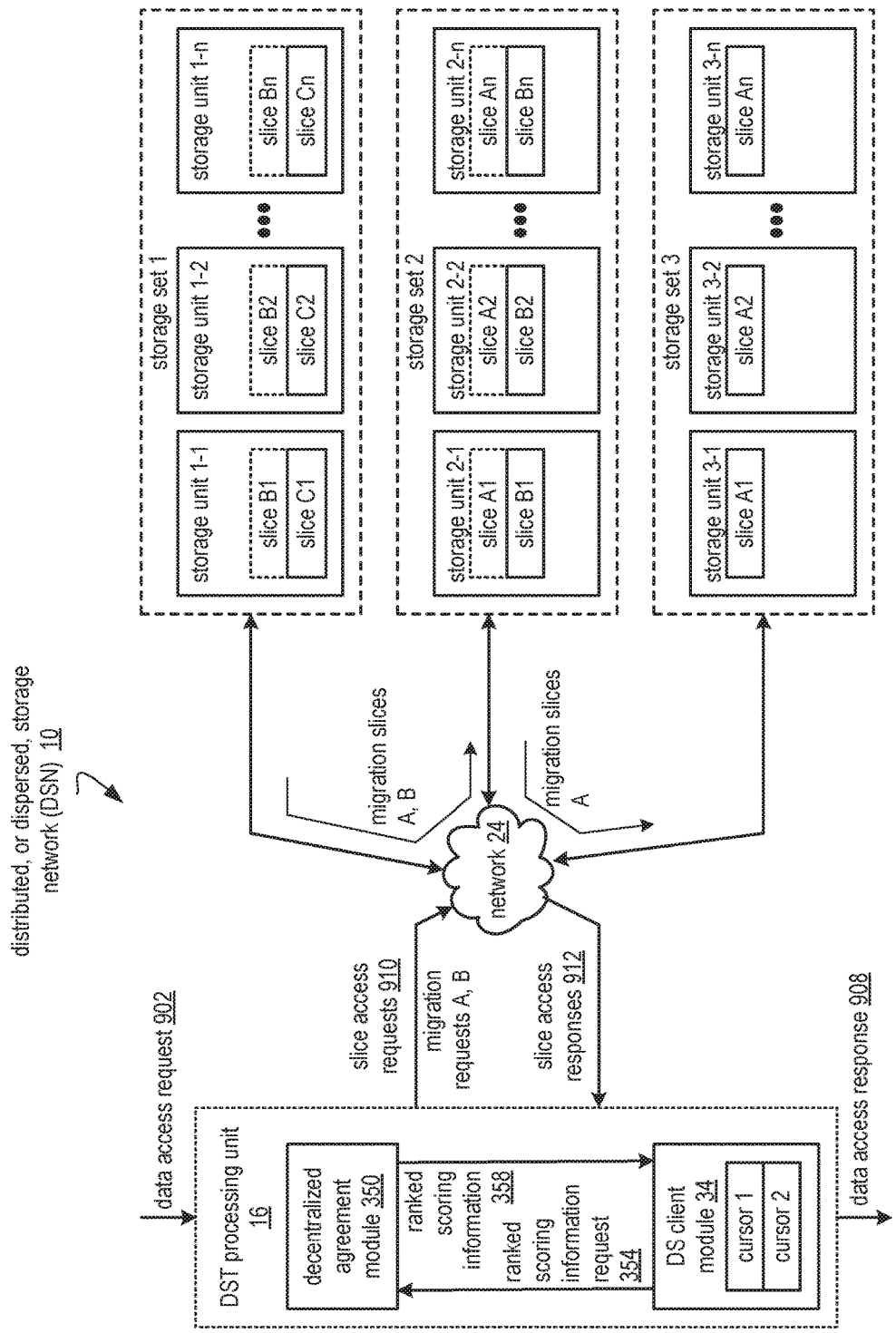
FIG. 9A is a schematic block diagram illustrating a method of accessing encoded data slices during a plurality of slice migrations in accordance with the present invention.

FIG. 9A is a schematic block diagram of another embodiment of a dispersed storage network (DSN) that illustrates a method of accessing encoded data slices during a plurality of slice migrations and includes the distributed storage and task (DST) processing unit 16 (computing device) of FIG. 1, the network 24 of FIG. 1, and a plurality of storage sets 1-3. The DST processing unit 16 includes the decentralized agreement module 350 of FIG. 9 and the DS client module 34 of FIG. 1. Each storage set includes a set of n storage units. Each storage unit may be implemented utilizing a storage unit 36 of FIG. 1. The DSN functions to access encoded data slices during a plurality of slice migrations between the storage sets.

In an example of operation of the accessing of the encoded data slices during the plurality of slice migrations, when facilitating a first migration of a plurality of sets of encoded data slices from an original source storage set (e.g., storage set 1) to an intermediate destinations storage set (e.g., storage set 2), the DST processing unit 16 identifies, for a second migration of the plurality of sets of encoded data slices, a new destination storage set for the plurality of sets of encoded data slices, where the plurality sets of encoded data slices are associated with a range of DSN addresses, and where a first cursor (cursor 1) of the first migration identifies a particular DSN address of a corresponding set of encoded data slices that is next up for migration from the original source storage set to the intermediate destinations storage set. The identifying of the new destination storage set includes the DS client module 34 issuing a ranked scoring information request 354 to the decentralized agreement module 350, where the decentralized agreement module 350 performs a decentralized agreement protocol function on the range of DSN addresses utilizing identifiers and new weights for the plurality of storage sets to produce ranked scoring information 358, and where a highest scoring result of the ranked scoring information is associated with the new destination storage set (e.g., storage set 3).

Having identified the new destination storage set, the DST processing unit 16 issues migration requests 910 to storage sets associated with current storage of sets of encoded data slices of the range of DSN addresses in accordance with the first cursor. For example, the DST processing unit 16 sends, via the network 24, migration requests A, B for range A and B encoded data slices, to the storage set 2 to send the A and B encoded data slices to the storage set 3; sends via the network 24, migration requests B, C for range B and C encoded data slices, to the storage set 1 to send the B and C encoded data slices to the storage set 3, when the cursor 1 indicates that all of the A encoded data slices have already been moved to the storage set 2, some of the B encoded data slices have been moved to the storage set 2, and none of the C encoded data slices have been moved from the storage set 1.

When the second migration of the plurality of sets of encoded data slices from the original source storage set and the intermediate destinations storage set to the new destination storage set is active, the DST processing unit 16 facilitates processing of a data access request 902 with a data access response 908 utilizing the first cursor and the second cursor, where the second cursor (cursor 2) identifies a particular DSN address of a corresponding set of encoded data slices that is next up for migration from at least one of the original source storage set and the intermediate destination storage set to the new destination storage set. The facilitating includes identifying the storage set for the data access request 902 based on the first and second cursors. For example, the DST processing unit 16 identifies the storage set 1 when the DSN address of the request is greater than the first cursor, identifies the storage set 2 when the DSN address of the request is less than the first cursor and greater than the second cursor, and identifies the storage set 3 when the DSN address of the request is less than the second cursor. Having identified the storage set for the data access request 902, the facilitating further includes the DST processing unit 16 issuing slice access requests to the DSN address of the identified storage set, receiving slice access responses, and generating the data access response 908 based on the slice access responses 912 (e.g., decoding slices to reproduce data for a read data access request and indicating storage status for a write data access request).

In one embodiment, the cursors are stored in each respective storage unit or collectively within the storage units. In this embodiment, the storage requests are sent to the original storage unit and the storage requests proxied if applicable to migrated data slices stored in another storage unit.

Figure 9B:
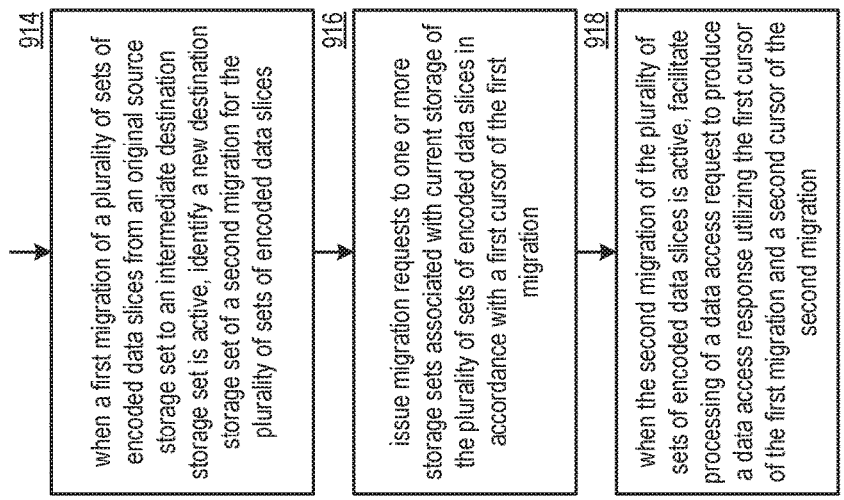
FIG. 9B is a logic diagram of an example of a method illustrating accessing encoded data slices during a plurality of slice migrations in accordance with the present invention.

FIG. 9B is a flowchart illustrating an example of accessing encoded data slices during a plurality of slice migrations. In particular, a method is presented for use in conjunction with one or more functions and features described in conjunction with FIGS. 1-2, 3-8, and also FIGS. 9 and 9A.

The method includes a step 914 where a DSN processing module (e.g., of a distributed storage and task (DST) processing unit), when the first migration of a plurality of sets of encoded data slices from an original source storage set to an intermediate destinations storage set is active, identifies a new destination storage set of a second migration for the plurality of sets of encoded data slices, where the plurality of sets of encoded data slices are associated with a range of a dispersed storage network (DSN) addresses (e.g., then it alludes sub ranges A, B, C), and where a first cursor of the first migration identifies a particular DSN address of a corresponding set of encoded data slices that is next up for migration from the original source storage set (e.g., a storage set 1) to the intermediate destinations storage set (e.g., a storage set 2). The identifying includes applying a decentralized agreement protocol function to the range of DSN addresses for a plurality of storage sets utilizing alternate weights for at least some of the plurality of storage sets to produce scoring resultants for each of the plurality of storage sets to identify a new destination storage set (e.g., identify a storage set 3 when the storage set 3 is associated with a highest scoring result of the plurality of scoring resultants).

The method continues at step 916 where the DSN processing module issues migration requests to one or more storage sets associated with current storage of the plurality of sets of encoded data slices in accordance with a first cursor of the first migration. For example, the issuing includes sending migration requests A and B, for range A and B encoded data slices, to the storage set 2 to send the A and B encoded data slices to the storage set 3; and sending migration requests B and C, for range B and C encoded data slices, to the storage set 1 to send the B and C encoded data slices to the storage set 3, when the cursor 1 indicates that all of the A encoded data slices have already been moved to the storage set 2, some of the B encoded data slices have been moved to the storage set 2, and none of the C encoded data slices have been moved from the storage set 1.

When the second migration of the plurality of sets of encoded data slices is active, the method continues at step 918 where the processing module facilitates processing of a data access request to produce a data access response 908 utilizing the first cursor of the first migration and a second cursor of the second migration, where the second cursor identifies a particular DSN address of a corresponding set of encoded data slices that is next up for migration from at least one of the original source storage set and the intermediate destination storage set to the new destination storage set. The facilitating further includes identifying the storage set for the data access request based on the first and second cursors, issuing slice access requests to the DSN address at the identified storage set, receiving slice access responses, and generating the data access response based on the slice access responses.

The method described above in conjunction with the processing module can alternatively be performed by other modules of the dispersed storage network or by other computing devices. In addition, at least one memory section (e.g., a non-transitory computer readable storage medium) that stores operational instructions can, when executed by one or more processing modules of one or more computing devices of the dispersed storage network (DSN), cause the one or more computing devices to perform any or all of the method steps described above.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions.

The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules of one or more computing devices of a dispersed storage network (DSN), the method comprises:
    identifying, when a first migration of a plurality of sets of encoded data slices from an original source storage set (first storage set) to an intermediate destination storage set (second storage set) is active, a new destination storage set (third storage set) of a second migration for the plurality of sets of encoded data slices;

issuing migration requests to one or more storage sets associated with current storage of the plurality of sets of encoded data slices in accordance with a first cursor of the first migration, the first cursor identifying a particular DSN storage address of a corresponding set of encoded data slices; and when the second migration of the plurality of sets of encoded data slices is active, facilitating processing of a data access request to produce a data access response utilizing the first cursor of the first migration and a second cursor of the second migration, where the second cursor identifies a particular DSN address of a corresponding set of encoded data slices that is next up for migration.

2. The method of claim 1, wherein the facilitating includes applying a decentralized agreement protocol function to a range of slice names for a plurality of storage sets utilizing alternate weights for at least some of the plurality the storage sets to identify a new recipient storage set.

3. The method of claim 1, wherein the issuing migration requests includes any of: sending first and second migration requests, for an address range including respective first and second encoded data slices, to the second storage set to send the respective first and second encoded data slices to the third storage set; sending third and fourth migration requests, for an address range including respective third and fourth encoded data slices, to the first storage set to send the respective third and fourth encoded data slices to the third storage set, when the first cursor indicates that all of the respective first encoded data slices have already been moved to the second storage set, at least part of the of the encoded data slices have been moved to the second storage set, and none of the respective fourth encoded data slices have been moved from the first storage set.

4. The method of claim 1, wherein the facilitating includes: identifying a storage set for the data access requests based on the first and second cursors.

5. The method of claim 4, wherein the identifying a storage set for the data access requests based on the first and second cursors includes: the first storage set when an DSN storage address of the data access request is greater than the first cursor, the second storage set when the DSN storage address of the data access request is less than the first cursor and greater than the second cursor, and the third storage set when the DSN address of the data access request is less than the second cursor.

6. The method of claim 1, wherein the facilitating further includes: issuing slice access requests to the DSN storage address at a corresponding storage set, receiving slice access responses, and generating the data access response based on the slice access responses.

7. The method of claim 3, wherein the plurality of sets of encoded data slices are associated with a range of DSN storage addresses that includes sub-ranges for the respective first, second and third encoded data slices.

8. A computing device of a group of computing devices of a dispersed storage network (DSN), the computing device comprises:
an interface;
a local memory; and
a processing module operably coupled to the interface and the local memory, wherein the processing module functions to:
identify, when a first migration of a plurality of sets of encoded data slices from an original source storage set (first storage set) to an intermediate destination storage set (second storage set) is active, a new destination storage set (third storage set) of a second migration for the plurality of sets of encoded data slices;

issue migration requests to one or more storage sets associated with current storage of the plurality of sets of encoded data slices in accordance with a first cursor of the first migration, the first cursor identifying a particular DSN storage address of a corresponding set of encoded data slices; and when the second migration of the plurality of sets of encoded data slices is active, facilitate processing of a data access request to produce a data access response utilizing the first cursor of the first migration and a second cursor of the second migration, where the second cursor identifies a particular DSN address of a corresponding set of encoded data slices that is next up for migration.

9. The computing device of claim 8, wherein the facilitating includes applying a decentralized agreement protocol function to a range of slice names for a plurality of storage sets utilizing alternate weights for at least some of the plurality the storage sets to identify a new recipient storage set.

10. The computing device of claim 8, wherein the issuing includes any of: sending first and second migration requests, for an address range including respective first and second encoded data slices, to the second storage set to send the respective first and second encoded data slices to the third storage set; sending third and fourth migration requests, for an address range including respective third and fourth encoded data slices, to the first storage set to send the respective third and fourth encoded data slices to the third storage set, when the first cursor indicates that all of the respective first encoded data slices have already been moved to the second storage set, at least part of the of the encoded data slices have been moved to the second storage set, and none of the respective fourth encoded data slices have been moved from the first storage set.

11. The computing device of claim 8, wherein the facilitating includes: identifying a storage set for the data access requests based on the first and second cursors.

12. The computing device of claim 11, wherein the identifying a storage set for the data access requests based on the first and second cursors includes: a first storage set when an DSN storage address of the data access request is greater than the first cursor, a second storage set when the DSN storage address of the data access request is less than the first cursor and greater than the second cursor, and a third storage set when the DSN storage address of the data access request is less than the second cursor.

13. The computing device of claim 8, wherein the facilitating further includes: issuing slice access requests to the DSN storage address at a corresponding storage set, receiving slice access responses, and generating the data access response based on the slice access responses.

14. The computing device of claim 8, wherein the plurality of sets of encoded data slices are associated with a range of DSN storage addresses that includes sub-ranges for the respective first, second and third encoded data slices.

15. A method for execution by one or more processing modules of one or more computing devices of a dispersed storage network (DSN), the method comprises:
identifying, while facilitating a first migration of a plurality of sets of encoded data slices from an original source storage set (first storage set) to an intermediate destination storage set (second storage set), for a second migration of the plurality of sets of encoded data slices, a new destination storage set (third storage set) for the plurality of sets of encoded data slices, wherein the plurality of sets of encoded data slices are associated with a range of DSN addresses, and wherein a first cursor of the first migration identifies a particular DSN address of a corresponding set of encoded data slices that is next up for migration from the original source storage set to the intermediate destinations storage set;

issuing migration requests to storage sets associated with current storage of sets of encoded data slices of the range of DSN addresses in accordance with the first cursor; and while the second migration of the plurality of sets of encoded data slices from the original source storage set and the intermediate destinations storage set to the new destination storage set is active, facilitating processing of a data access request to produce a data access response utilizing the first cursor and a second cursor, wherein the second cursor identifies a particular DSN address of a corresponding set of encoded data slices that is next up for migration from at least one of the original source storage set and the intermediate destinations storage set to the new destination storage set.

16. The method of claim 15, wherein the facilitating includes applying a decentralized agreement protocol function to a range of slice names for a plurality of storage sets utilizing alternate weights for at least some of the plurality the storage sets to identify a new recipient storage set.

17. The method of claim 15, sending first and second migration requests, for an address range including respective first and second encoded data slices, to the second storage set to send the respective first and second encoded data slices to the third storage set; sending third and fourth migration requests, for an address range including respective third and fourth encoded data slices, to the first storage set to send the respective third and fourth encoded data slices to the third storage set, when the first cursor indicates that all of the respective first encoded data slices have already been moved to the second storage set, at least part of the of the encoded data slices have been moved to the second storage set, and none of the respective fourth encoded data slices have been moved from the first storage set.

18. The method of claim 15, wherein the facilitating includes: identifying a storage set for the data access requests based on the first and second cursors.

19. The method of claim 18, wherein the identifying a storage set for the data access requests based on the first and second cursors includes: the first storage set when an DSN address of the data access request is greater than the first cursor, the second storage set when the DSN address of the data access request is less than the first cursor and greater than the second cursor, and the third storage set when the DSN address of the data access request is less than the second cursor.

20. The method of claim 15, wherein the facilitating further includes: issuing slice access requests to the DSN address at a corresponding storage set, receiving slice access responses, and generating the data access response based on the slice access responses.

* * * * *